US006356129B1

(12) United States Patent
O'Brien et al.

(10) Patent No.: US 6,356,129 B1
(45) Date of Patent: Mar. 12, 2002

(54) LOW JITTER PHASE-LOCKED LOOP WITH DUTY-CYCLE CONTROL

(75) Inventors: David E. O'Brien, Boston; Timothy W. Sheen, Brighton; Marc R. Hutner, Cambridge; Michael A. Mittelbrunn, Boston; Abdelkebir Sabil, Brighton, all of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/416,578

(22) Filed: Oct. 12, 1999

(51) Int. Cl.[7] .............................................. H03K 3/017
(52) U.S. Cl. ........................ 327/175; 327/156; 327/294; 375/376
(58) Field of Search ................................ 327/147, 149, 327/153, 156, 158, 161, 291, 293–296, 175, 172, 165, 217; 375/376, 371

(56) References Cited

U.S. PATENT DOCUMENTS

| | | | | |
|---|---|---|---|---|
| 3,813,604 A | * | 5/1974 | Denoncourt ................... 327/5 |
| 4,330,751 A | * | 5/1982 | Swain ......................... 327/114 |
| 4,835,486 A | * | 5/1989 | Somerville ................... 330/10 |
| 4,943,787 A | * | 7/1990 | Swapp .......................... 331/2 |
| 5,036,298 A | | 7/1991 | Bulzachelli .................. 331/23 |
| 5,075,639 A | * | 12/1991 | Taya ............................. 331/2 |
| 5,281,926 A | * | 1/1994 | Rabii .......................... 331/14 |
| 5,491,439 A | * | 2/1996 | Kelkar et al. ............... 327/157 |
| 5,550,499 A | * | 8/1996 | Eitrheim ..................... 327/175 |
| 5,563,921 A | * | 10/1996 | Mesuda et al. ............. 375/376 |
| 5,654,674 A | * | 8/1997 | Matsuno .................... 331/1 R |
| 5,675,273 A | * | 10/1997 | Masleid ...................... 327/156 |
| 5,675,620 A | * | 10/1997 | Chen .......................... 375/376 |
| 5,699,024 A | * | 12/1997 | Manlove et al. ........... 331/111 |
| 5,828,255 A | * | 10/1998 | Kelkar et al. ............... 327/157 |
| 5,900,757 A | * | 5/1999 | Aggarwal et al. .......... 327/198 |

FOREIGN PATENT DOCUMENTS

| | | | | |
|---|---|---|---|---|
| EP | 0419823 A | 4/1991 | ............. H03L/7/23 |
| EP | 0709967 A | 5/1996 | ............. H03L/7/23 |

* cited by examiner

Primary Examiner—Tuan T. Lam
Assistant Examiner—Hai L. Nguyen
(74) Attorney, Agent, or Firm—Bruce D. Rubenstein

(57) ABSTRACT

A timing circuit for ATE generates an output clock from an input clock and controls output pulse width. The timing circuit includes a differential driver having an input that receives the input clock, and having inverting and non-inverting outputs. The inverting output is coupled to a first phase-locked loop, and the non-inverting output is coupled to a second phase-locked loop. The first and second phase-locked loops respectively generate first and second clocks in response to respective rising and falling edges of the input clock. A combiner circuit converts the first and second clocks into narrow pulse trains, and the pulse trains respectively operate SET and RESET inputs of a SET/RESET flip-flop. The SET/RESET flip-flop generates an output clock having rising edges responsive to rising edges of the input clock, and falling edges responsive to falling edges of the input clock. The timing circuit also includes a frequency divider in feedback path of the phase-locked loops, for establishing a frequency gain of the timing circuit. Pulse width of the output clock is based upon pulse width of the input clock and frequency gain of the timing circuit. To promote timing accuracy, the frequency responses of the phase-locked loops are tailored to selectively filter jitter from the input clock that is uncorrelated with jitter in the ATE, but to pass correlated jitter unattenuated.

22 Claims, 14 Drawing Sheets

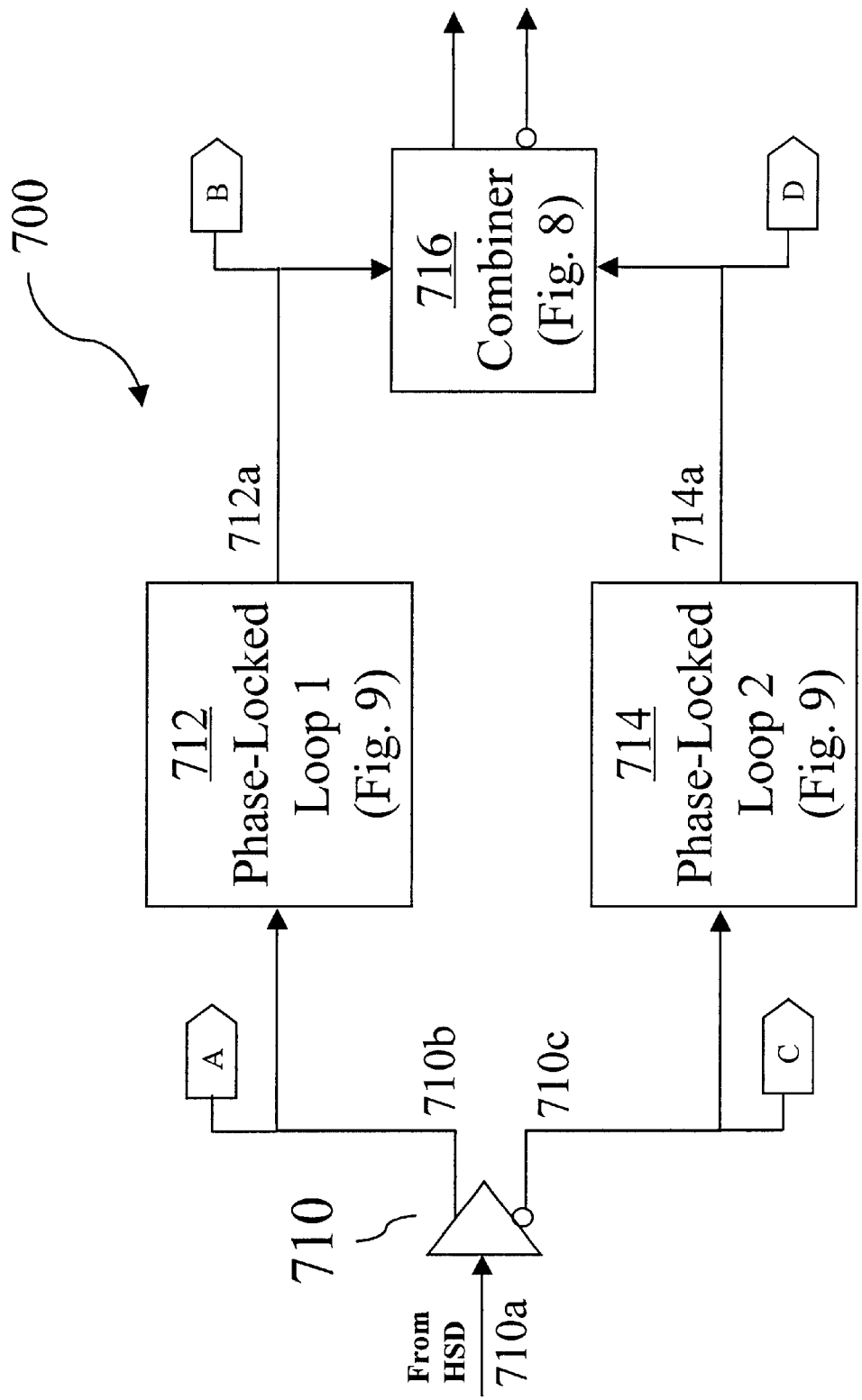

LOW JITTER PHASE-LOCKED LOOP WITH DUTY-CYCLE CONTROL

This application relates generally to automatic test equipment, and more particularly to timing circuits for testing electronics in automatic test systems.

Recent developments in mixed-signal products for multimedia video, data conversion, and the Internet have spurred a demand for faster, more accurate, and more complex systems for testing these products. "Mixed-signal" products provide a mix of analog and digital functionality and include, for example, analog-to-digital converters, digital-to-analog converters, modems, disk drive controllers, transceiver links, digital radios, and high-speed interpolators. To test mixed-signal products, automatic test equipment (ATE) generally supplies both analog and digital test resources, often simultaneously, and at high speed.

FIG. 1 illustrates a setup for testing an analog-to-digital converter (ADC), a common mixed-signal product. A unit under test (UUT) 112 includes an ADC 114 connected to a test system 110. The test system supplies an analog signal to the ADC via an analog source 116, and receives digital codes from the ADC via digital I/O 120. A clock 118 provides a clock signal to the ADC 114. If the ADC is operating properly, the digital codes produced by the ADC represent the states of the analog signal at instants in time defined by the clock 118. For each active edge of the clock 118, the ADC performs a new conversion of the analog signal, and produces a new digital output value—a process called "sampling." Typically, the test system 110 also includes a computer (not pictured) that reads the digital values from the digital I/O 120, and tests them to verify that the ADC is operating properly.

Testing mixed-signal devices such as the ADC of FIG. 1 customarily involves varying the frequency of the sample clock signal to approach or exceed the device's maximum specified rate. We have recognized that it would also be desirable to vary the duty cycle and pulse width of the sample clock signal. Mixed-signal devices often specify characteristics such as signal-to-noise ratio (SNR) and distortion. These characteristics vary as a function of the duty cycle or pulse width of the applied sample clock. The ability to vary the duty cycle and pulse width of the sample clock would thus facilitate mixed-signal testing and characterization.

Like all electronic devices, mixed-signal devices inherently generate noise. As shown in FIG. 2b, an ADC receiving an input signal that consists of three pure tones produces a power spectrum revealing these three tones, plus a plurality of noise components. Compared with this actual power spectrum, the power spectrum of an ideal, theoretical ADC shown in FIG. 2a generates no noise.

One of the ways in which noise manifests itself in ATE systems is in the form of "jitter" on the clock signal. "Jitter" is a timing error of a periodic signal, measurable in seconds, and observable as random movements in time of signal edges from cycle to cycle, relative to their ideal, or average, positions.

FIGS. 3–5 illustrate the effects of jitter on digital values read back from an ideal ADC, configured in the manner shown in FIG. 1. FIG. 3 illustrates an ideal case: a pure tone 318 is sampled by the ideal ADC with a jitterless clock signal 312 to produce a discrete time representation 310. As there is no jitter, the sampling period 316 is perfectly regular between any two adjacent clock pulses. In FIG. 4, the same ideal ADC samples the same pure tone 318; however, the sampling clock suffers from jitter. The jitter appears as irregularity in the intervals between adjacent pulses 416 of the clock signal 412. Although the sampled values 414 perfectly represent the values of the input tone 318 at the instant that each sample is taken, the spacing of the sampled values 414 is irregular.

FIG. 5 illustrates the effect of the jitter of FIG. 4 on a typical test system. The sampled data 510 is the same as the data 410 of FIG. 4, except that the data has been regularly spaced. Absent a way of correcting for clock jitter, an ATE system will process the sampled data as if the edges occurred regularly—exactly as shown in FIG. 5. In contrast with the perfect tone 318 that was sampled, the output values 510 contain noise. As far as the ATE can determine, the effects of clock jitter are indistinguishable from amplitude noise in the ADC or analog source.

Previous techniques have attempted to reduce jitter in mixed-signal testing. According to one technique, a free-running crystal oscillator is used in place of the ATE clock 118. The free-running crystal is connected directly to the UUT's clock input, in a manner similar to FIG. 1. Crystal oscillators are inherently stable and are commercially available with very low jitter. Therefore, the free-running, crystal oscillator technique typically reduces ATE-induced jitter.

Because the crystal oscillator is "free-running," however, its period is not inherently synchronized with the period of the ATE clock, i.e., the two clocks are not "coherent." The ADC makes a new conversion upon each active edge of the crystal oscillator, but the digital I/O 120 retrieves values from the ADC under the control of a separate, ATE clock. Non-coherency adds noise to sampled data.

FIG. 6a shows the power spectrum of a pure tone sampled by an ideal ADC and clocked by an ideal crystal oscillator, but read by a non-coherent ATE clock. The resulting power spectrum reveals distinctive "skirts" around the input tone. FIG. 6b shows a power spectrum acquired under identical conditions, except the two clocks are coherent. Compared with the power spectrum produced by the coherent clocks, the power spectrum produced by the non-coherent clocks is broader. The broader spectrum requires more time to process and thus reduces tester throughput.

With the free-running clock technique, errors are also introduced by "windowing" of the input signal. "Windowing" is a well-known DSP algorithm in which data is collected over a predetermined time interval and multiplied sample-by-sample by a window function. The free-running clock technique requires windowing because the analog source 116 is not inherently synchronized with the clocking of the ADC. Thus, the ATE has no direct control over when a complete period of the input signal has been sampled. Windowing cuts off periodic signals in mid-stream, and distorts the power spectra of sampled signals.

A second approach to reducing clock jitter is disclosed by Fang Xu in international patent application number PCT/US97/10753, filed Jun. 26, 1997, published Dec. 30, 1998, and assigned to Teradyne, Inc. In that application, Xu discloses a high-Q band-pass filter built from an array of quarter-wavelength, transmission line stubs. The filter is connected in series between a digital channel of the ATE (or other signal source) and the UUT. Xu's filter works by passing a predetermined fundamental frequency and its odd harmonics, but attenuating all other frequencies. Perfect square waves contain odd harmonics only. Thus, Xu's filter passes square waves unattenuated. Duty cycles that are different from 50% correspond to even harmonics, however, and Xu's filter eliminates them. As jitter equates to random changes in the duty cycle, Xu's filter reduces jitter while preserving square wave shape and edge speed.

Because its frequency response is fixed by the geometry of its constituent parts, Xu's filter generally operates at one frequency only. This limitation negatively impacts ATE programs, which preferably test devices over a range of operating conditions. Although it is possible to modify Xu's filter to produce variable frequencies, the modified filters tend to be large. Xu's filters also become larger for lower frequency signals. As space tends to be short near the UUT in ATE systems, Xu's filter is not practical where low, or variable, frequencies are desired. In addition, Xu's filter specifically blocks duty cycles that are different from 50%, and is thus impractical for applications in which users wish to vary duty cycle.

SUMMARY OF THE INVENTION

With the foregoing background in mind, it is an object of the invention to provide a clock with controllable duty cycle.

It is another object of the invention to provide independent control of the leading and trailing edges of the clock.

Another object is to reduce jitter on both leading and trailing edges of the clock.

Yet another object is to synchronize activities of the ATE, to promote tester coherency.

To achieve the foregoing objects and other objectives and advantages, a timing circuit receives an input clock and generates an output clock. The timing circuit significantly reduces jitter of the input clock, and controls the duty cycle of the output clock.

In accordance with one embodiment of the invention, a timing circuit for automatic test equipment includes a first phase-locked loop that provides a first clock signal, and a second phase-locked loop that provides a second clock signal. The first and second clock signals have a predetermined phase relationship. The timing circuit further includes a combiner, having first and second inputs respectively coupled to the outputs of the first and second phase-locked loops. The combiner has an output that generates an alternating succession of high and low logic levels in response to the first and second clock signals.

In accordance with an aspect of the invention, the timing circuit includes a differential circuit that receives an input signal. The differential circuit has a non-inverted output coupled to the first phase-locked loop and an inverted output coupled to the second phase-locked loop.

In accordance with another embodiment of the invention, a method of generating a low-jitter clock signal from an input signal includes providing an input clock signal to first and second phase-locked loops. The method further includes generating, by the first phase-locked loop, a first regenerated clock signal that is phase-locked to rising edges of the input signal. The method includes the second PLL generating a second regenerated clock signal that is phase-locked to falling edges of the input signal. The first and second regenerated clock signals are combined to generate an output clock having an alternating succession of high and low logic levels.

In accordance with another embodiment of the invention, a method of testing a UUT in a test system that has a master clock, for example a reference oscillator, includes generating an analog waveform for input to the UUT. The analog waveform has a sampling rate derived from the master clock. The method further includes clocking the UUT with a clock signal having a frequency derived from the master clock, and sampling a digital output from the UUT at a sampling rate derived from the master clock. The clock signal includes a first frequency band that includes jitter components that are common to the master clock and a second frequency band that includes jitter components that are not common to the master clock. The clocking step further includes substantially passing the first frequency band and substantially filtering the second frequency band.

In accordance with still another embodiment of the invention, a method is disclosed for generating an output clock from an input clock, wherein the duty cycle of the output clock is determined by the duty cycle of the input clock. The method includes multiplying the frequency of the input clock responsive to rising edges of the input clock to generate a first multiplied clock. The method also includes multiplying the frequency of the input clock responsive to falling edges of the input clock to generate a second multiplied clock. The first and second multiplied clocks are combined to generate an output clock. The output clock has rising edges responsive to one of the first and second multiplied clocks and falling edges responsive to the other of the first and second multiplied clocks.

Additional objects, advantages and novel features of the invention will become apparent from a consideration of the ensuing description and drawings.

BRIEF DESCRIPTION OF THE DRAWINGS

The invention will be better understood by reference to the following more detailed description and accompanying drawings in which

FIG. 7 is a block diagram of a timing circuit arranged in accordance with the invention;

DESCRIPTION OF THE PREFERRED EMBODIMENT

Figure 1:
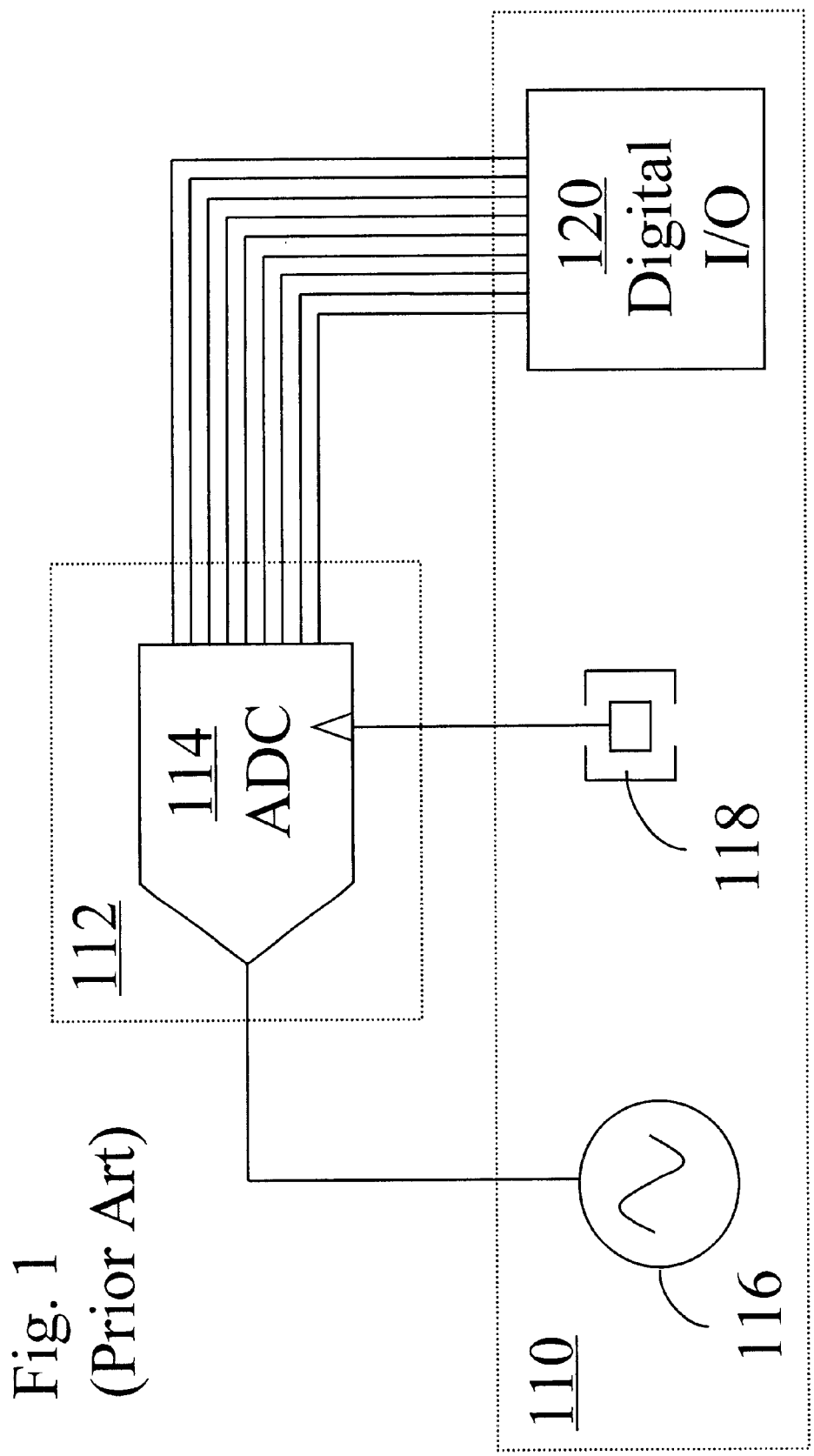
FIG. 1 is block diagram of a mixed-signal testing setup according to the prior art.
Figure 2A:
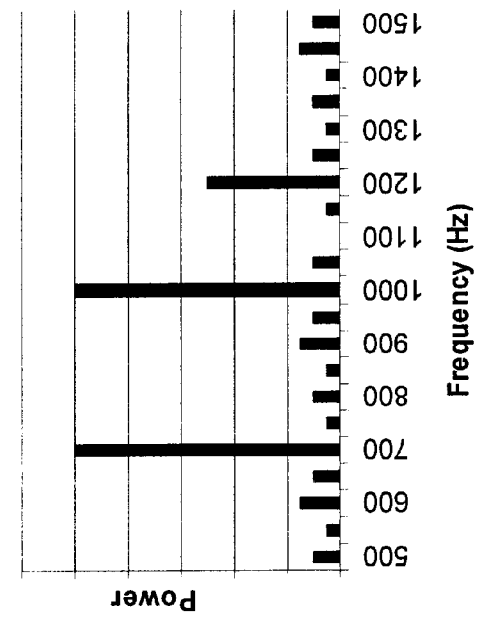
FIGS. 2A and 2B are graphs that illustrate the power spectra of a signal without noise (FIG. 2A) and with noise (FIG. 2B)
Figure 2B:
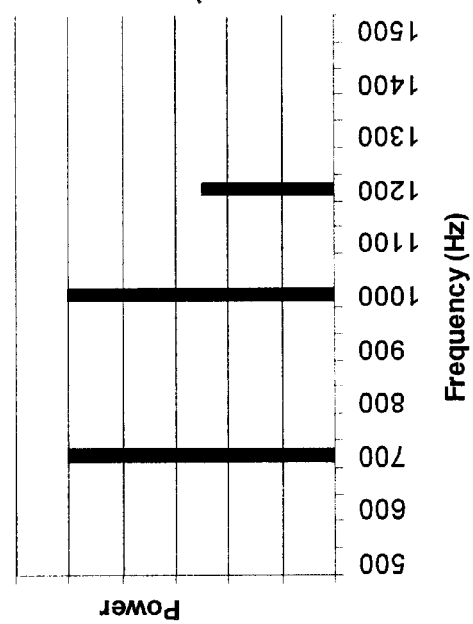
Figure 6A:
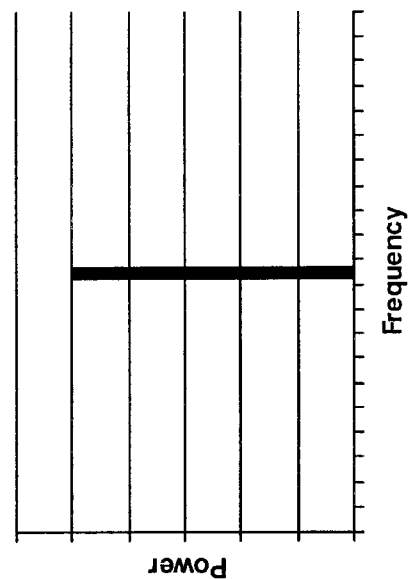
FIGS. 6A and 6B show the effect of clock coherency on power spectra of a sampled pure tone. The clocks are coherent in FIG. 6B and non-coherent in FIG. 6A.
Figure 6B:
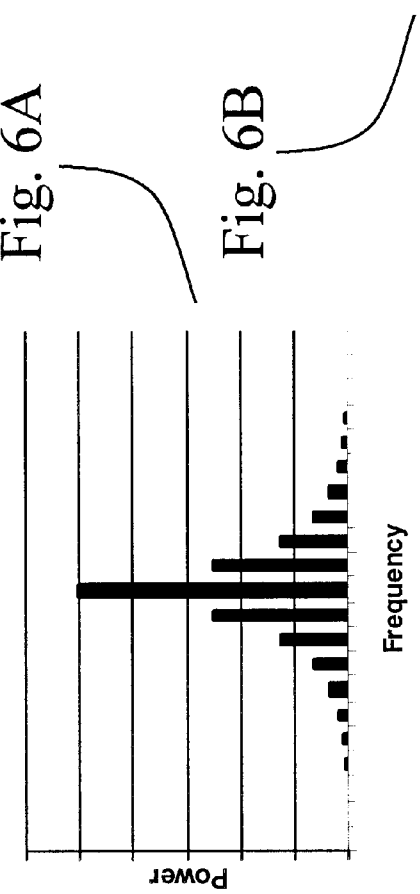
Figure 3:
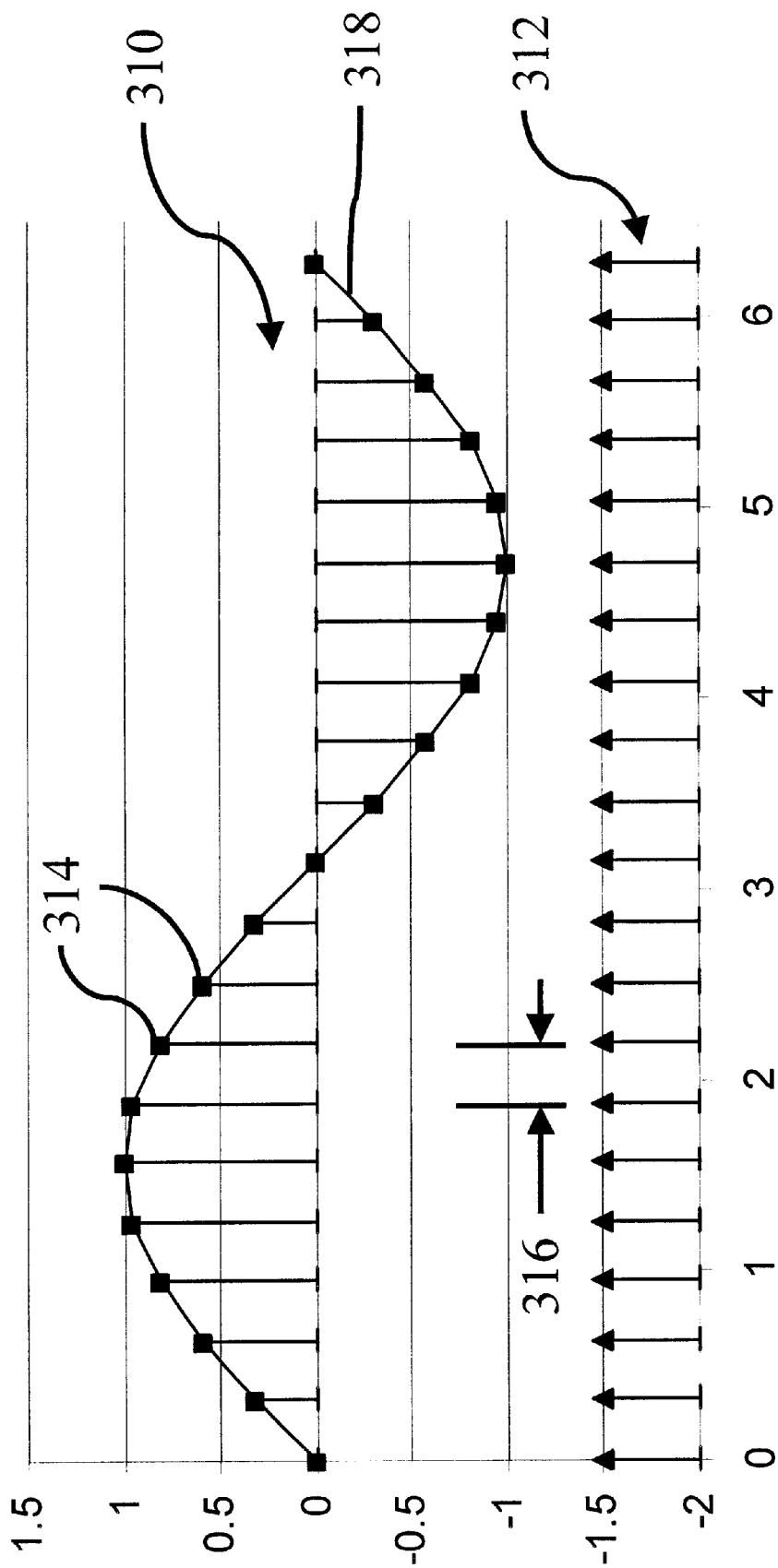
FIG. 3 is a graph that illustrates discrete sampling of a pure tone with a zero-jitter clock.
Figure 4:
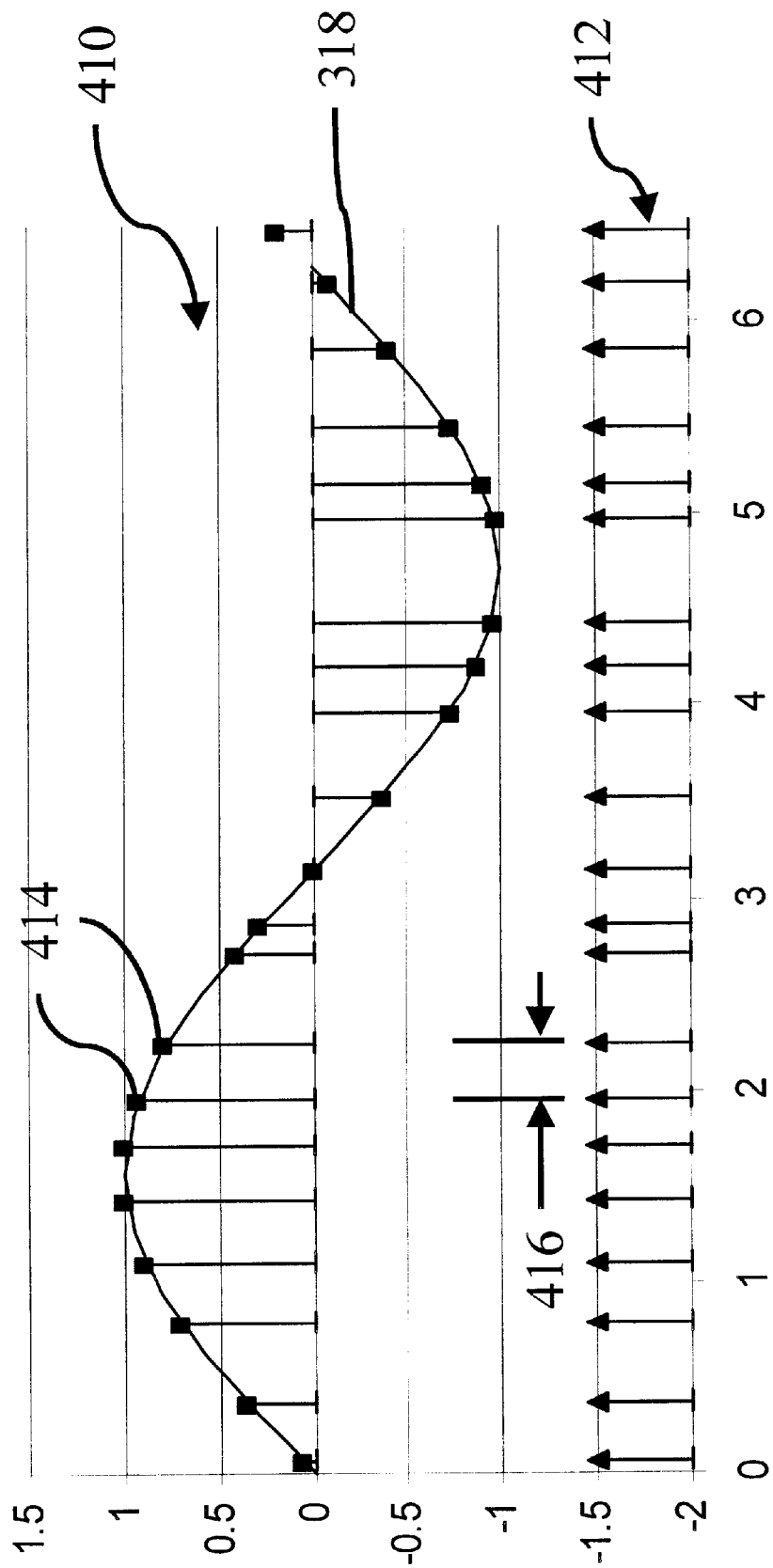
FIG. 4 is a graph that illustrates discrete sampling of the pure tone of FIG. 3 with a clock that has jitter.
Figure 5:
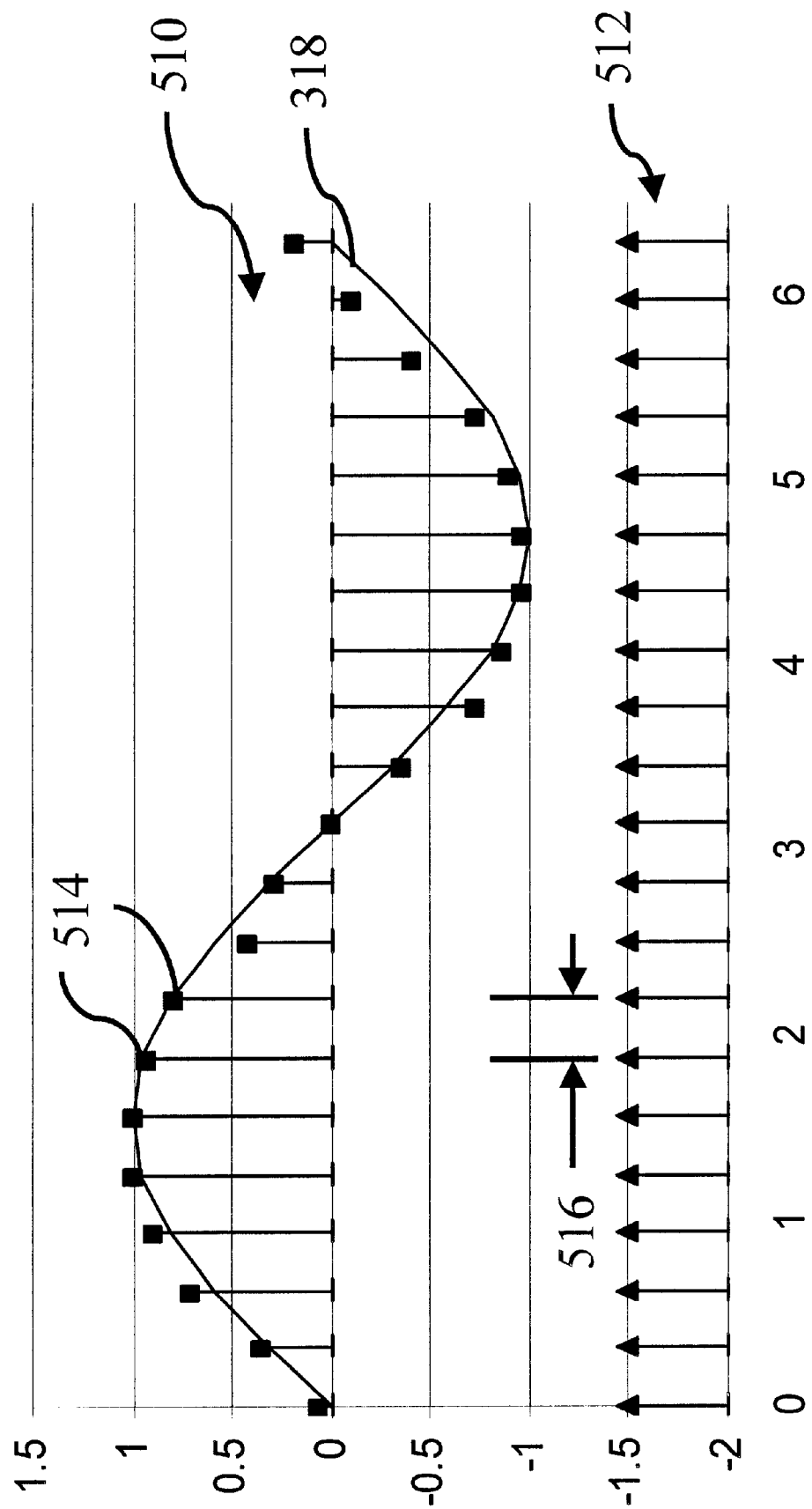
FIG. 5 is a graph that shows the effect of jitter on the sampled tone of FIG. 3.

The timing circuit according to the invention operates as part of Teradyne's Catalyst™ mixed-signal test system, although it can be used in a variety of environments. The Catalyst™ test system includes a 100 MHz master clock and a plurality of high-speed digital channels (HSDs) connectable to a UUT for digitally exercising the UUT. A plurality of timing generators receive the master clock and derive frequency and edge placements for the HSDs based upon user input. Duty cycle of an HSD can be varied from nearly zero to nearly one hundred percent by varying the placement of the rising and falling edges of the HSD in 10 picosecond ($10*10^{-12}$ seconds) increments. Frequency of an HSD can be varied from DC to 200 MHz.

The Catalyst™ test system also includes analog sources and receivers for providing analog stimulus and response to the UUT. The analog sources and receivers receive digital control to generate discrete output levels, or to capture discrete input levels, under the direction of the master clock.

The Catalyst™ test system also includes digital I/O for reading and writing digital words to the UUT, again according to timing controlled by the master clock. The HSDs, analog sources and receivers, and digital I/O all derive their timing characteristics from the same master clock, and are thus all "coherent."

As the Catalyst™ master clock controls the timing of the HSDs, analog sources and receivers, and digital I/O, jitter in the master clock manifests itself in each of these system components. Because jitter in the master clock is common to all of these components, however, the master clock jitter contributes only slight errors. For example, an HSD edge may be displaced due to jitter, and therefore an ADC may be clocked earlier or later than it should. But the analog source feeding the ADC is displaced by the same interval. As the displacement is the same for both the clock and the source, the errors largely cancel each other out. Any errors that result from the displacement are substantially absent from the digital codes produced by the ADC.

Not all jitter cancels out. We have recognized that the timing generators that derive the HSD signals add jitter to the HSD outputs that is not common to the rest of the system. Unlike the common jitter, which is "correlated" throughout the system, this "uncorrelated" jitter contributes errors that limit the accuracy of the test system.

The timing circuit according to the invention reduces uncorrelated jitter, while at the same time preserving correlated jitter. Tests of the timing circuit according to the invention have shown a reduction in uncorrelated jitter from as much as 19 picoseconds to less than 1 picosecond RMS.

Overall Structure

FIG. 7 illustrates a timing circuit 700 according to the invention. An input signal 710a, for example a signal from an HSD, has a predefined frequency and duty cycle, and is connected to an input of a differential circuit 710. The differential circuit 710 has a non-inverting output 710b and an inverting output 710c. Upon rising edges of the input signal 710a, the non-inverting output 710b of the differential circuit generates rising edges and the inverting output 710c generates falling edges. Upon falling edges of the input signal 710a, the non-inverting output 710b generates falling edges and the inverting output 710c generates rising edges.

The timing circuit 700 includes first and second phase-locked loops (PLLs), respectively 712 and 714. The non-inverting output 710b of the differential circuit 710 is coupled to the input of the first PLL 712. The inverting output 710c of the differential circuit is coupled to the input of the second PLL 714. Preferably, the first and second PLLs 712 and 714 are substantially identical and have low inherent jitter. The first and second PLLs also preferably have very low timing skew between their outputs, i.e., the phase difference between their outputs is the same as the phase difference between their inputs.

During normal operation, both PLLs lock to edges at their respective input signals. Owing to the inversion of one output of the differential circuit 710 but not the other, the first and second PLLs align with opposite polarity edges of the input signal 710a. For example, if the output signal of the first PLL aligns with rising edges of the input signal 710a, the output signal of the second PLL aligns with falling edges. The outputs 712a and 714a of the first and second PLLs join at a combiner 716. The combiner 716 combines these outputs generate an output clock having characteristics of the output signals from both PLLs.

Figure 8B:
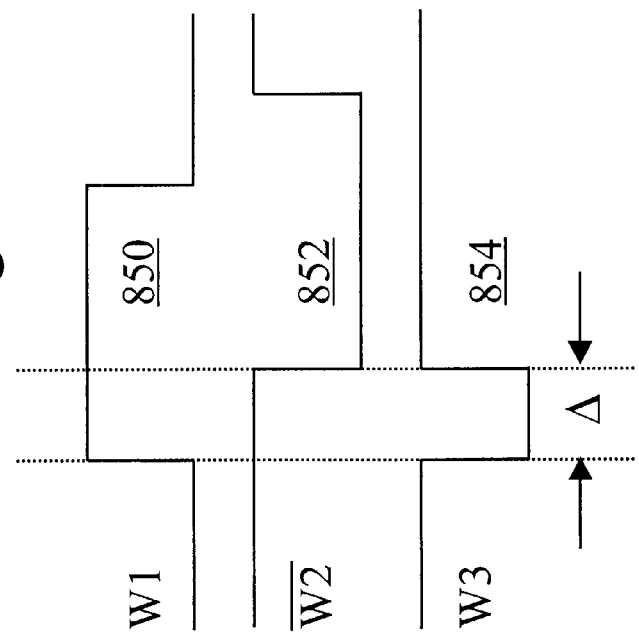
FIG. 8*b* is a timing diagram of the combiner of FIG. 8*a;*
Figure 8A:
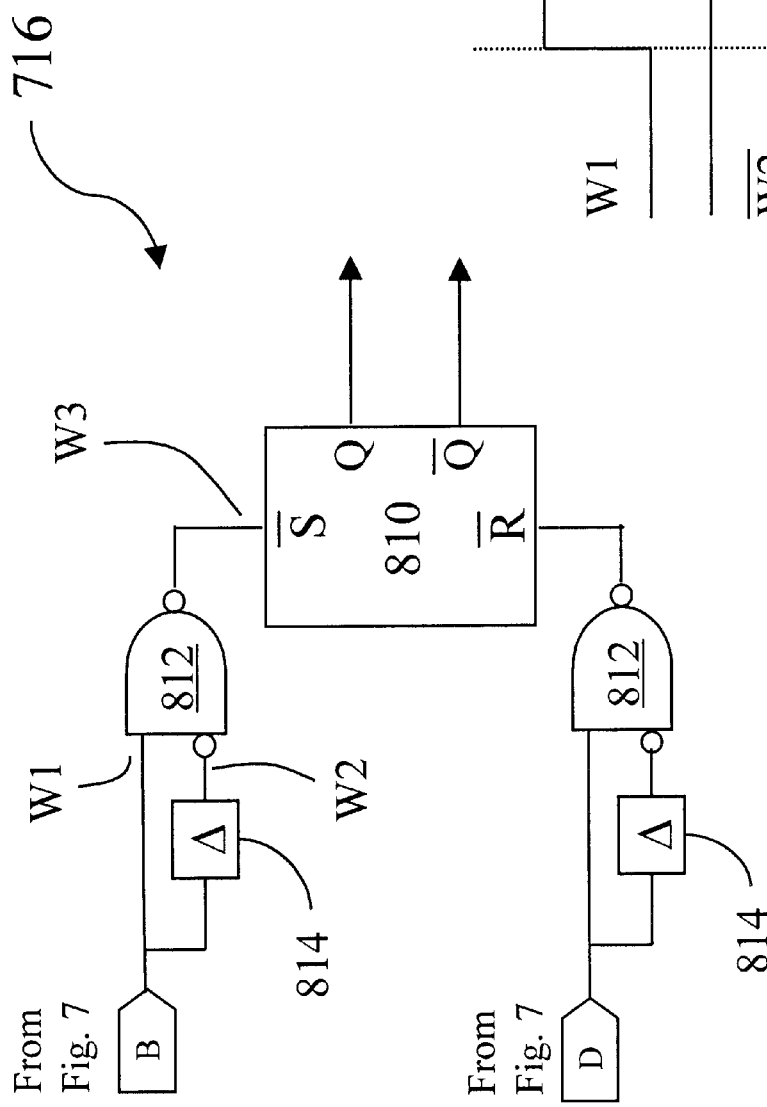
FIG. 8*a* is a schematic view of the combiner of FIG. 7.

FIG. 8a illustrates an embodiment of the combiner 716 according to the invention. A flip-flop 810, for example a SET/RESET flip-flop, receives the outputs 712a and 714a of the first and second PLLs at SET and RESET inputs, respectively. A signal from the first PLL, for example a high level, activates the SET input of the flip-flop 810 and causes the flip-flop to assume one state (for example, Q=high). A later signal from the second PLL activates the RESET input of the flip-flop 810 and causes the flip-flop to assume an opposite state (for example, Q=low). The flip-flop 810 thus changes its state once for each edge of the input signal (assuming a frequency gain of one, described below). The flip-flop "sets" in response to each rising edge of the input signal and "resets" in response to each falling edge. The flip-flop 810 therefore reproduces the timing of both of the edges of the input signal 710a, and therefore preserves the pulse-width and duty cycle of the input signal.

The operation described above pertains to the case in which the PLLs operate without frequency gain, i.e., wherein output equals input frequency. The timing circuit according to the invention is not limited, however, to non-multiplying operation. The PLLs can operate with frequency gain greater than one. In these circumstances, the flip-flop 810 changes its state multiple times for each edge transition of the input signal. Operation at multiplied frequencies is described with reference to FIGS. 15–18 below.

Most SET/RESET flip-flops, like the flip-flop 810, produce an indeterminate state when the SET and RESET inputs are both active simultaneously. The flip-flop 810 is susceptible to this condition if the pulse widths at the SET and RESET inputs are longer than the desired output pulse width. To prevent indeterminacy in the combiner 716, each of the SET and RESET inputs of the flip-flop 810 is equipped with a series-connected one-shot circuit. As shown in FIG. 8a, each one-shot circuit includes a logic gate 812, for example a differential NAND gate, and a delay element 814 coupled to an inverting input of the logic gate. As shown in FIG. 8b, each one-shot circuit converts clock signals having arbitrarily long pulse widths into pulse trains having a fixed-length pulse width. The duration of the pulse width equals the delay time "Δ" of the delay element 814. Preferably, the delay time Δ is chosen to be extremely short, for example, 500 picoseconds, just long enough to satisfy the hold time specification of the flip-flop 810. As the flip-flop 810 assumes an indeterminate state only when its input pulses overlap, limiting the input pulse widths to 500 picoseconds clears the way for operation up to one Gigahertz.

Preferably, the PLLs 712/714 provide their outputs as differential signals, and the NAND gate 812 has differential inputs. Inversion of one input of the NAND gate is accomplished by crossing the differential signals at its input. The delay element 814 preferably consists of a length of controlled-impedance differential transmission line, buried within shielded layers of the printed circuit board on which the one-shot circuit is implemented. Alternatively, the delay element 814 can be implemented with one or more logic gates, or with a commercially available delay line. Care should be taken, using techniques known by those skilled in the art, to minimize induced jitter.

Preferably, the digital components of the timing circuit 700 are implemented using Positive Emitter-Coupled Logic (PECL), for example from the ECLinPS-Lite™ family of integrated circuits, manufactured by Motorola, Inc.

As an alternative to the differential circuit 710, any circuit that produces phase-shifted shifted output signals accomplishes the objective of independent control over both edges of the clock signal. According to another alternative, the differential circuit 710 is omitted, and the PLLs are constructed to respond to edges of opposite polarity.

Ideally, the first and second PLLs have the same propagation delay between their inputs and outputs. Due to normal variations in component properties, however, propagation delays cannot be matched exactly. The resulting timing skew between the PLLs distorts the relationships between rising and falling edges, making output pulses appear either narrower or wider than the corresponding input pulses. According to the invention, timing skew is compensated by manipulating the edge placement of rising and falling edges of the input signal, for example, a signal from an HSD. In the Catalyst™ system, HSD timing is user-programmed and controlled by system software. Skew between the PLLs can be measured, and edges of the HSD individually adjusted to bring the PLL signals into alignment. Alternatively, the PLLs each can include a variable delay line that is adjustable to compensate for skew. As a variant on this scheme, one PLL can include a constant, bulk delay and the other can include a variable delay. The variable delay is offset and has enough adjustment range to span both sides of the bulk delay.

Phase-Locked Loop Structure

Figure 9:
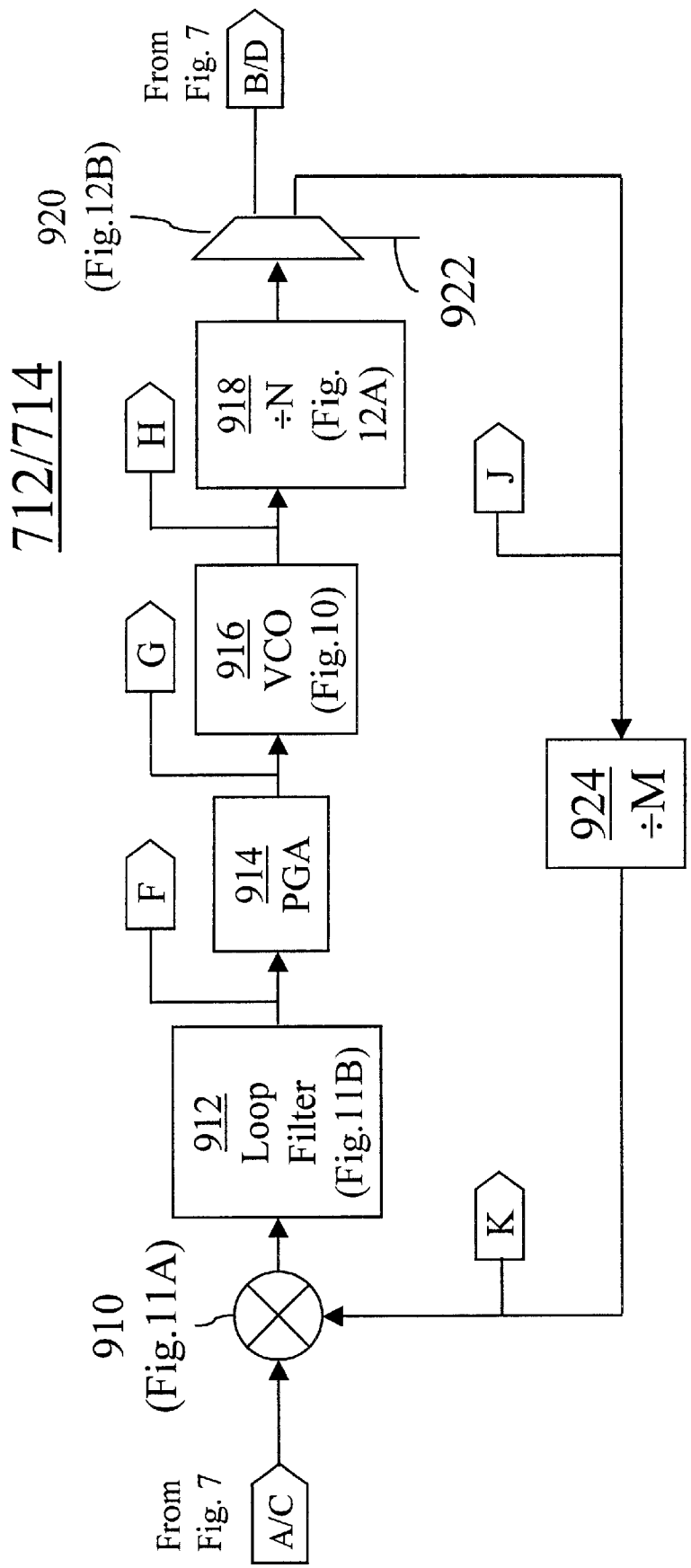
FIG. 9 is a block diagram of the PLLs of FIG. 7.

FIG. 9 is a block diagram of a PLL, such as PLLs 712 and 714, according to the invention. The PLL 712/714 includes elements conventionally found in PLL circuits, for example, a phase detector 910, loop filter 912, and voltage-controlled oscillator 916. As is known, the phase detector 910 has first and second inputs and an output. The output of the phase detector is proportional to a phase difference between signals at the first and second inputs. Also as is known, the loop filter 912 stabilizes the feedback of the PLL 712/714, and the VCO 916 converts a voltage from the loop filter into a signal having a frequency that varies with the applied voltage.

In addition to these elements customarily found in PLL circuits, the PLL 712/714 also includes first and second frequency dividers, respectively 918 and 924. They also include a programmable-gain amplifier (PGA) 914, and a selector 920. The first and second frequency dividers each divide the output frequency of the VCO by a predefined constant. The PGA amplifies the output of the loop filter 912 by a programmable gain, and the selector 920 selectively passes or blocks output and feedback signals of the PLL. The selector 920 separately controls the output and feedback signals of the PLL, and thus allows the PLL to skip output pulses while the PLL continues to operate with feedback.

The first frequency divider 918 is disposed in the forward path of the PLL and has the effect of dividing the VCO frequency by a constant "N." The second frequency divider 924 is disposed in the feedback path and has the effect of dividing the output frequency by a constant "M." Because the first frequency divider 918 is in the forward path of the feedback loop, it has no effect on the closed-loop frequency gain of the PLL—the feedback servos around the division. But the second frequency divider 924 does affect the closed-loop gain. As the PLL's feedback tends to equalize the two inputs to the phase detector 910, it drives the frequency of the output signal up by a factor of M. The PLL thus manifests an overall frequency gain equal to M.

The PLL 712/714 is designed to operate between 1 MHz and 1 GHz—nearly a 10-octave range. The VCO 916, however, is variable over only a one-octave range (between 2 and 4 GHz, described below). Therefore, meeting the design goals of the PLL involves varying the divider values over a large range.

Varying the divider values M and N changes the performance of the PLL. The loop gain of the PLL 712/714 is inversely proportional to the product M*N. "Loop gain" refers to the overall gain around the loop, for example, the gain between the first and second inputs of the phase detector 910. In a known manner, the loop gain of a PLL affects the PLL's settling time, accuracy, stability, and other AC characteristics. If left uncompensated, each change to M or N would change the loop gain of the PLL 712/714, and thus would change the AC characteristics of the PLL. Of particular relevance, each change to M or N would affect the ability of the PLL to filter jitter from its input signal.

To avoid this occurrence, the PGA 914 is used by the PLL 712/14 to cancel out the effects of the frequency dividers. The PGA 914 operates by establishing a voltage gain between its input and output in response to programmable control. The gain of the PGA is varied in direct proportion to the product M*N, to keep the loop gain (and AC characteristics) substantially constant over the entire range of output frequencies.

The PGA 914 is preferably disposed between the output of the loop filter 912 and the input of the VCO 916. This placement is not critical, however. Alternatively, the PGA can be positioned anywhere in the analog signal path of the PLL 712/714. For example, the PGA could precede, rather than follow, the loop filter 912, or could be built into the loop filter 912. According to another alternative, the dynamics of the loop filter 912 are varied to achieve different values of loop gain, and a separate PGA not required.

The PGA 914 can be made from commercially available components or combinations thereof. In the preferred embodiment, the PGA 914 consists of two cascaded channels of an AD604, available from Analog Devices Incorporated, of Norwood, Mass. The overall gain of the resulting PGA can be varied over a 96 dB range.

Preferably, the timing circuit 700 includes a field-programmable gate array (FPGA, not shown) to control the PGA gain, as well as other functions of the timing circuit. Alternatively, discrete digital logic can be used. The ATE can also directly control the PGA gain by writing to a register within the timing circuit.

Voltage-Controlled Oscillator

Figure 10:
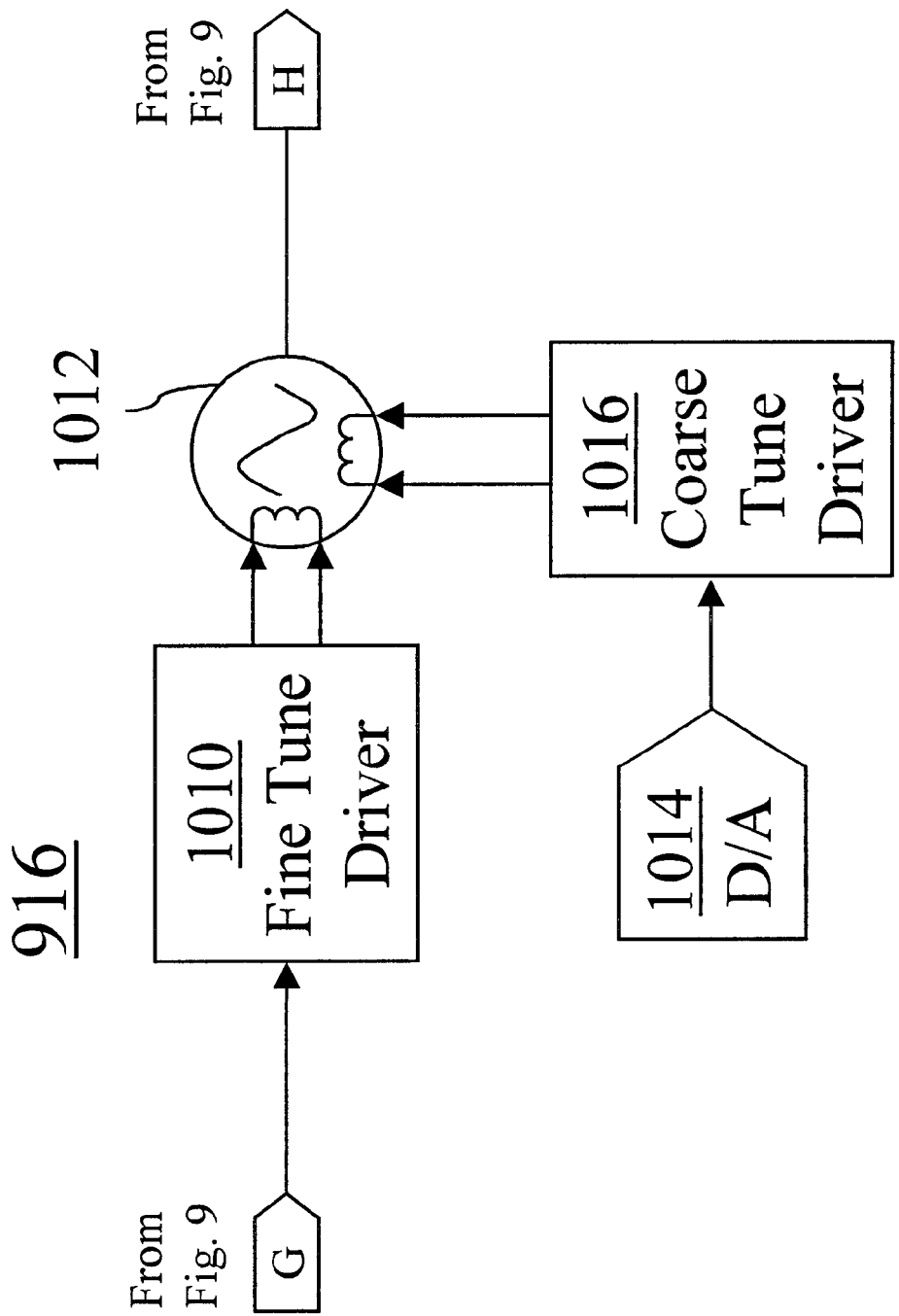
FIG. 10 is a block diagram of the oscillator of FIG. 9.

Although voltage-controlled oscillators are conventionally included in PLLs, the VCO 916 according to the invention is not a conventional design. FIG. 10 illustrates the VCO 916 according to the invention. The VCO 916 includes a low-jitter, stable oscillator 1012 having a frequency range from 2 GHz to 4 GHz. The oscillator 1012 is preferably a "YIG" oscillator, such as model MLPB-0204 from Micro Lambda, Incorporated, of Dayton, Ohio. The YIG oscillator includes a Yttrium-Iron Garnet sphere fabricated using a thin-film process to yield a high-Q resonator. The resonator produces an output frequency proportional to an applied magnetic field. The magnetic field is supplied by a permanent magnet within the sphere that includes separate electromagnetic coils for coarse-tuning and fine-tuning of applied magnetic field. The fine-tuning port of the YIG oscillator is band limited to 400 kHz, and protects the oscillator against wide-band noise. The YIG oscillator achieves a very low phase noise of –130 dBc/Hz at 100 kHz offset from a 4 GHz carrier frequency.

The VCO 916 includes a coarse-tune driver 1016 coupled to the course adjustment coil of the YIG oscillator. The coarse-tune driver 1016 receives it input from a digital-to-analog converter (DAC) 1014. The DAC and the course tune driver establish an approximate operating frequency of the YIG oscillator, which frequency corresponds to an expected output frequency of the YIG oscillator when the PLL is locked. Preferably, a capacitor is placed across the coarse-tune coil to protect the coarse-tune coil from spurious noise.

The VCO also includes a fine-tune driver 1010 coupled to the fine adjustment coil of the YIG oscillator. By operation of the feedback of the PLL 712/714, the fine-tune driver 1010 zeroes in on a value that precisely controls the output frequency.

Magnetic field is directly proportional to applied current. Therefore, the coarse and fine-tune drivers 1016 and 1010 preferably supply their outputs in the form of currents. The coarse and fine-tune drivers 1016 and 1010 are preferably voltage-controlled current sources.

Alternatively, the coarse and fine-tune drivers supply outputs in the form of voltages, and rely upon the parasitic resistance of the coils to develop the YIG tune currents. However, the voltage-controlled technique cannot compensate for changes in the resistance of the control coils with changes in temperature. Coil resistance depends strongly upon temperature, and drift in coil current changes the operating frequency of the YIG. If current through the coarse-tune coil changes by a large enough margin, the feedback will be unable to servo around the change and the PLL will break out of lock. As for the fine-tune driver, voltage control of the fine-tune coil adds a pole to the transfer function of the PLL. The added pole unnecessarily complicates stabilization of the PLL.

Preferably, the DAC 1014 is programmed using the same control source as the PGA 914. For example, an FPGA controls both the DAC 1014 and the PGA 914.

Phase Detector/Loop filter

Figure 11:
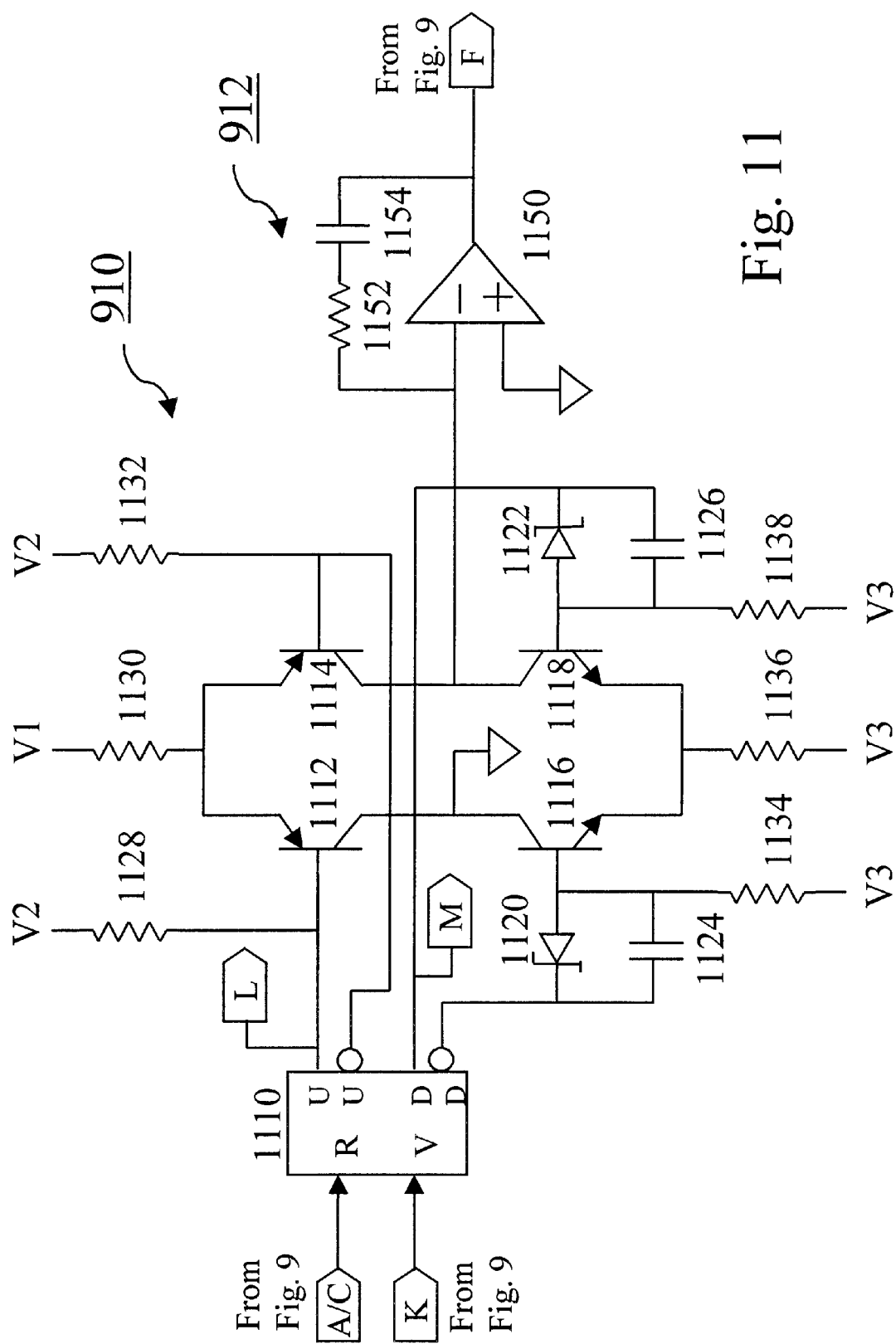
FIG. 11 is a schematic view of the phase detector 910 and filter circuit of FIG. 9.

FIG 11 schematically illustrates the phase detector 910 and loop filter 912 according to the invention. The phase detector 910 includes a digital phase detector 1110 coupled to a voltage-controlled current source (VCCS). The VCCS includes transistors 1112, 1114, 1116, and 1118, and the accompanying bias resistors, capacitors, and diodes. The digital phase detector 1110 generates UP and DOWN output pulses, and their complements, in response to phase differences between a clock signal at a reference input "R" and a clock signal at a variable input "V." The VCCS receives the digital output signals and generates an analog current. The VCCS respectively sources and sinks current to a virtual ground of the loop filter 912 in response to the UP and DOWN pulses from the digital phase detector 1110.

Preferably, to promote fast response time, current flow is continuously maintained in the output transistors 1112, 1114, 1116, and 1118 of the VCCS. The magnitudes of the currents change, however, in response to the outputs of the digital phase detector 1110. The digital phase detector 1110 is preferably a PECL device, such as a model MCK 12140, from Motorola, Inc.

Preferably, voltage V1 is +5 v, V2 is +3 v, and V3 is –5 v, to be compatible with both the PECL outputs of the digital phase detector 1110 and the ground-referenced analog electronics of the loop filter 912. Logic families and supply voltages can be varied, however, as known by those skilled in the art, within the scope of the invention.

The VCCS reduces jitter at the output of the PLL. First, the differential circuit attenuates noise from the PECL supply. Because the PECL supply noise appears equally in both circuit branches of the VCCS, the noise is common mode. Therefore, the effects of the PECL supply noise cancel out at the output of the VCCS. Second, the differential circuit increases the phase detector gain, which decreases the overall PLL jitter. The PLL requires a certain value of forward gain (the product of the gains of the phase detector 910, PGA 914, VCO 916, and divider 918) to achieve its output frequency range. We have recognized that the PGA 914 generates more noise than the phase detector 910. By increasing the gain of the phase detector 910, the gain—and therefore the noise contribution—of the PGA can be reduced, reducing the overall jitter of the PLL.

As shown in FIG. 11b, the loop filter 912 is arranged as an integrator. The loop filter includes an amplifier 1150, for example and operational amplifier, a feedback capacitor 1154, and a feedback resistor 1152. The feedback capacitor 1154 operates in combination with the phase detector 910 to establish a pole at DC in the loop gain of the PLL. The feedback resistor 1152 adds a zero to the integrator's closed-loop response and helps to stabilize the overall feedback of the PLL.

The poles and zeros of the loop filter 912 have a dominant effect in determining the frequency response of the PLL as a whole, and therefore have a dominant effect on the jitter transfer function. By adjusting the poles and zeros of the loop filter 912, the jitter transfer function of the PLL can be tailored to selectively filter jitter of different frequencies.

Divider Circuit and Selector

Figure 12:
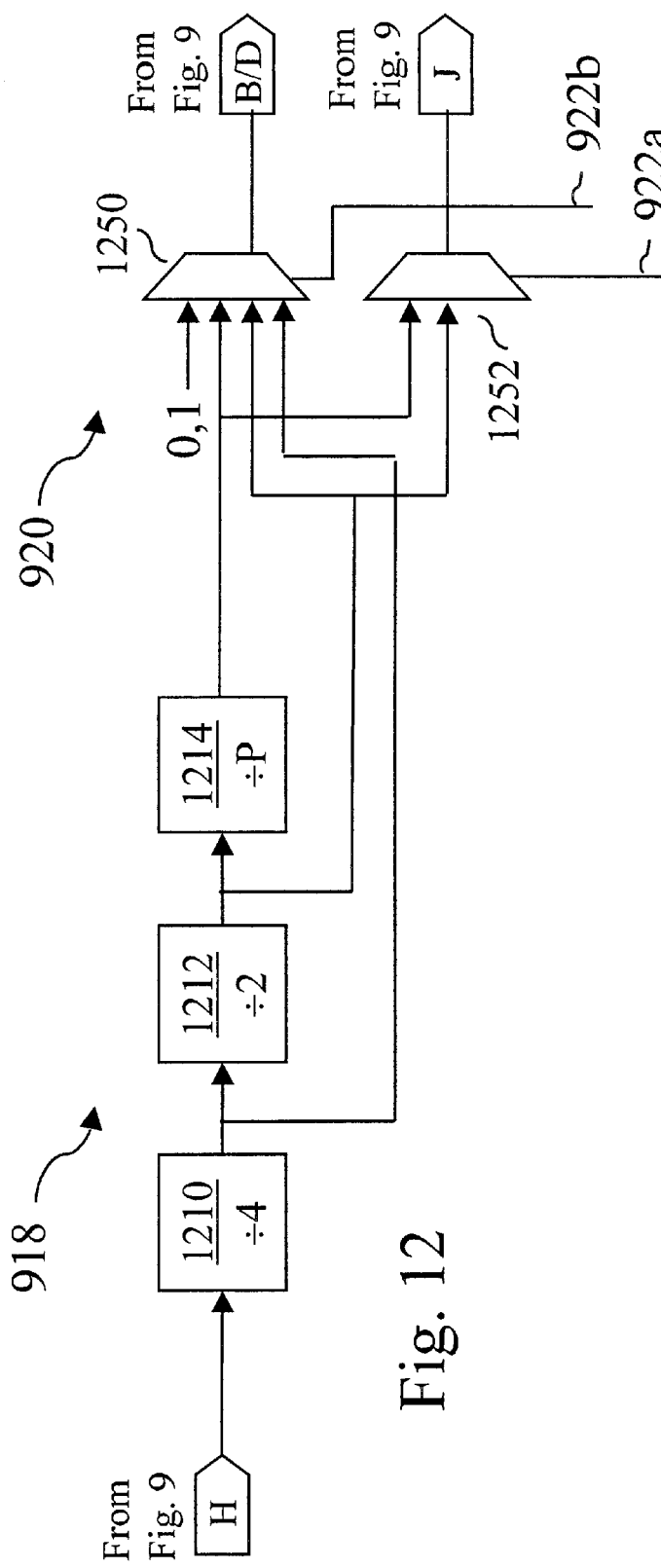
FIG. 12 is a block diagram of the first frequency divider and selector of FIG. 9.

FIG. 12 illustrates the first frequency divider 918 and selector 920 according to the invention. As shown in FIG. 12, the first frequency divider 918 includes a pre-scaler 1210 that divides the output frequency of the YIG by a fixed factor of 4. The pre-scaler 1210 is preferably fabricated from gallium arsenide, rather than silicon, to handle the 2–4 GHz frequency range of the YIG oscillator. The output of the pre-scaler 1210 is coupled to a fixed, divide-by-two counter 1212, then to a programmable, divide-by-P counter 1214.

Also as shown in FIG. 12, the selector 920 includes first and second selector devices, respectively 1250 and 1252. The outputs of the pre-scaler 1210 and the two counters 1212 and 1214 connect to the first selector device 1250, where they are selectably passed to the output of the PLL by operation of a control signal 922b. The outputs of the counters 1212 and 1214 also connect to the second selector device 1252, where they are selectably passed back to the phase detector 910 of the PLL by operation of a control signal 922a.

By distributing the output and feedback signals between the first and second selectors 1250 and 1252, the PLL according to the invention allows different signals to be output and fed back. For example, the PLL can directly supply the output of the pre-scaler 1210 to its output, at the same time as it directly supplies the output of the divideby-P counter 1214 to its feedback. Thus, the PLL can output signals having higher frequencies than the feedback can track. Often, it is desirable to skip pulses or otherwise turn a clock signal off, while continuing to operate the PLL. The selector 1250 provides this capability by selecting either a fixed high state "1" or a fixed low state "0," while the PLL continues to lock on the input signal.

Lock Detector

Figure 13:
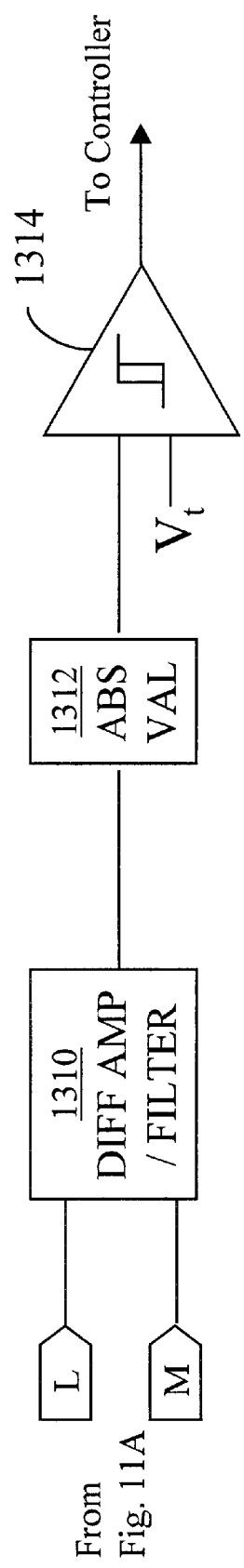
FIG. 13 is a block diagram of a lock detector used in conjunction with the timing circuit of FIG. 7.

FIG. 13 illustrates a simple and efficient phase-lock detector used in conjunction with the invention. The UP and DOWN signals from the digital phase detector 1110 couple to inverting and non-inverting inputs of a differential amplifier 1310. The differential amplifier 1310 generates a positive voltage in response to an UP signal, and a negative voltage in response to a DOWN signal. The differential amplifier preferably includes a low-pass filter, for averaging the positive and negative excursions of the differential amplifier. Alternatively, a separate low-pass filter can be provided.

The output of the differential amplifier 1310 connects to an absolute value circuit 1312, which generates positive signals for both positive and negative inputs, in a manner analogous to taking the absolute value of the circuit's input. The output of the absolute value circuit 1312 connects to an input of a comparator 1314. A reference signal $V_t$ connects to another input of the comparator. When the number of UP pulses from the digital phase detector 1110 equals the number of down pulses, the PLL has locked. In response to the locked condition, the output of the absolute value circuit 1312 approaches zero and crosses the reference voltage. The comparator 1314 then changes its output state. Preferably, the comparator 1314 has input hysteresis—it requires a movement at its input greater than the expected noise level to change its state once it is locked or unlocked.

Tailoring the PLL Transfer Function

Our measurements have shown that uncorrelated jitter sets a noise floor of the test system, which remains relatively constant with frequency. Jitter induced by the PLL itself (primarily the VCO) exceeds this noise floor at low frequencies and decreases exponentially as frequency increases. Our measurements have also shown that most correlated jitter is situated within 2 or 3 kHz of the HSD frequency. We have recognized that the negative effects of jitter can be minimized by setting the bandwidth of the PLL to the crossover frequency of the PLL-induced jitter and the uncorrelated jitter. In the particular hardware implementation described above, this optimal setting is about 5 kHz. With the bandwidth of the PLL set to this optimal value, the PLL passes the lion's share of correlated jitter and filters the lion's share of VCO noise. The PLL also filters uncorrelated jitter above this optimal value.

By varying the gain of the PGA 914, as described above, the loop bandwidth can be maintained at its optimal value, regardless of the values M and N of the frequency dividers 924 and 914. The PLL thus keeps jitter to a minimum over the full range of operating conditions.

Operation of Timing Circuit

Figure 14:
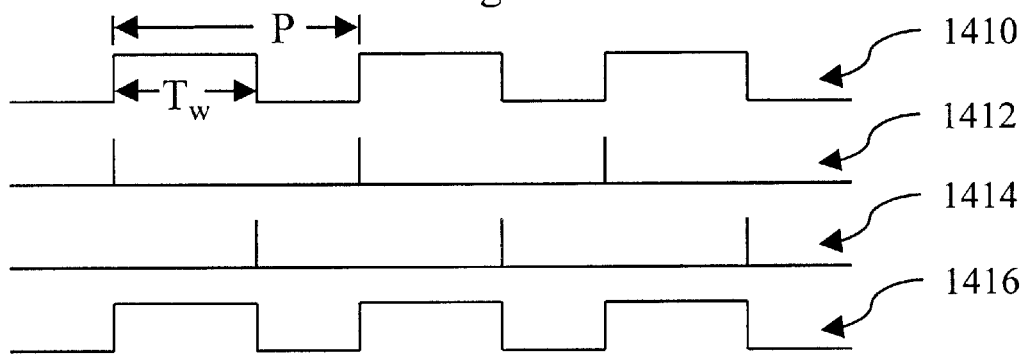
FIG. 14 is a timing diagram that shows regeneration of an input clock signal performed by the timing circuit of FIG. 7, wherein the regenerated clock preserves the duty cycle of the input clock.
Figure 15:
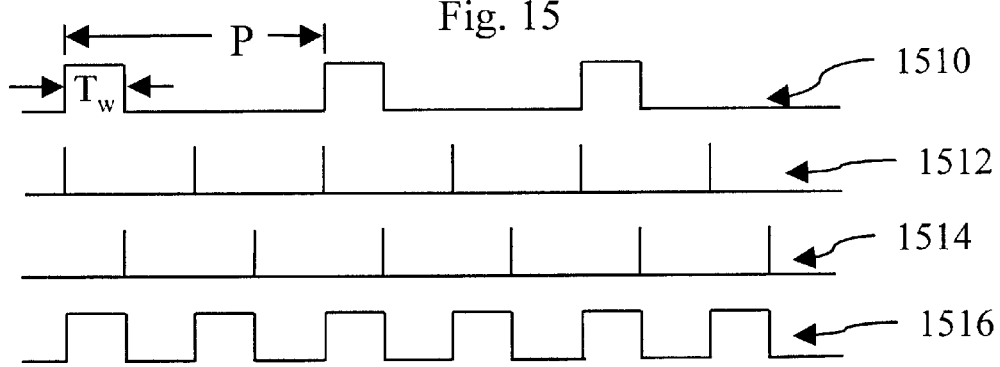
FIGS. 15 and 16 are timing diagrams that show frequency multiplication of a clock signal performed by the timing circuit of FIG. 7, wherein the pulse width of the multiplied clock is controlled by the pulse width of the input clock.
Figure 16:
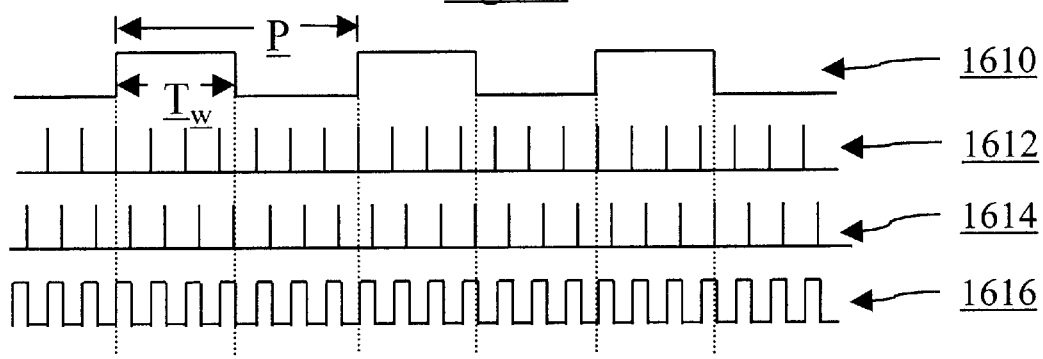

FIGS. 14–16 illustrate the operation of the timing circuit 700 for three different values of frequency gain. As shown in FIG. 14, the timing circuit 700 has a frequency gain of one, and receives an input signal 1410 having a period "P" and a pulse width "$T_W$". The first PLL 712 generates a first clock signal in response to rising edges of the input signal 1410, and the second PLL 714 generates a second clock signal in response to falling edges of the input signal 1410. One-shot circuits in the combiner 716 convert the first and second clock signals into first and second pulse trains, respectively 1412 and 1414. The SET/RESET flip-flop 810 successively "sets" in response to the first pulse train 1412, and successively "resets" in response to the second pulse train 1414. The resulting output signal of the SET/RESET flip-flop 810, the output clock 1416, has rising edges responsive to rising edges of the input signal 1410, and falling edges responsive to falling edges of the input signal 1410. The period and pulse width of the output clock 1416 is the same as the period and pulse width of the input signal 1410. Therefore, the timing circuit 700 regenerates the input clock 1410, while preserving duty cycle and pulse width.

FIG. 15 illustrates the operation of the timing circuit 700 with a frequency gain of two. The PLLs 712 and 714 generate clocks having twice the frequency of the input clock 1510, and one-shot circuits convert the clocks into pulse trains 1512 and 1514. The SET/RESET flip-flop 810 generates an output clock 1516 from the pulse trains, as before. Although the frequency of the output clock 1516 is twice the input frequency, the pulse width of the input clock is preserved.

A final example is shown in FIG. 16. Here, the timing circuit is operated with a frequency gain of eight. As before, the PLLs 712 and 714 each generate output signals, this time each having eight times the frequency of the input signal 1610, and the one-shot circuits convert the clocks into pulse trains 1612 and 1614. The output clock 1616 has a frequency equal to eight times the frequency of the input clock 1610.

FIG. 16 shows how the timing circuit can be used to generate relatively short output pulses from relatively long input pulses. Thus, the timing circuit can be used for pulse width division as well as frequency multiplication. Pulse width division is particularly desirable when the user wishes to generate output clocks having shorter pulse widths than an HSD is capable of providing.

The timing circuit divides the pulse width of an input signal any time that the frequency multiplication M causes the period of the timing circuit's output signal to be shorter than the input pulse width. As can be seen from the waveforms of FIGS. 14–16, the output pulse width always equals the remainder of the input pulse width divided by the output period. The output pulse width can thus be expressed mathematically as $$T_{wOut} = T_{wIn} \text{MODULO } P_{Out}, \text{ where } P_{Out} = P_{In}/M, \text{ or} \quad (1)$$

$$T_{wOut} = T_{wIn} \text{MODULO } (P_{In}/M). \quad (2)$$

By combining pulse width division with pulse skipping (see "Divider Circuit and Selector," above), the timing circuit can independently control both the pulse width and the frequency of its output signals.

Figure 17:
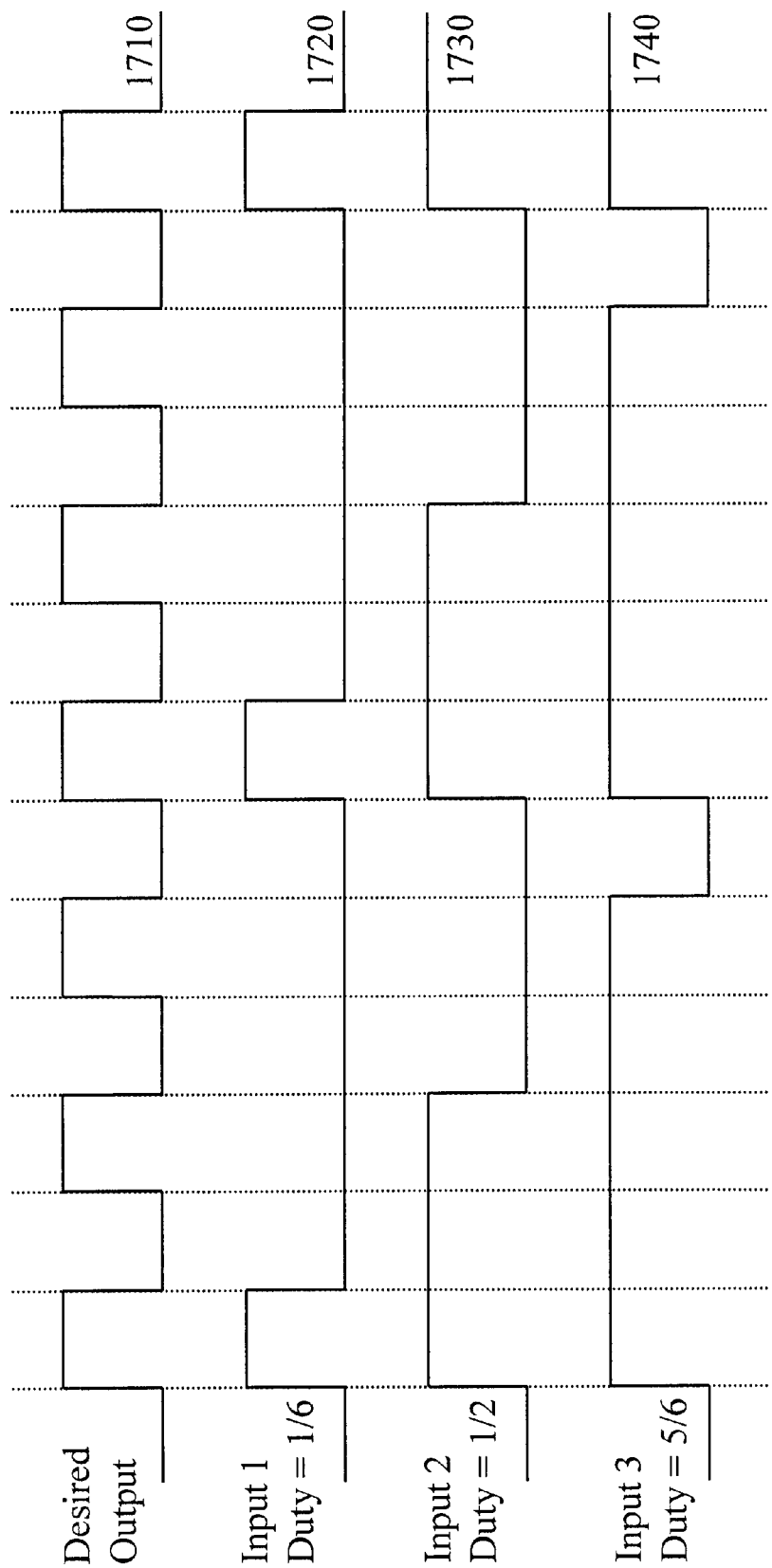
FIG. 17 is a timing diagram that shows how the timing circuit of FIG. 7, when operated with frequency multiplication, can generate identical output clocks from different input clocks.

The timing circuit can generate any desired output signal from M different input signals. As shown in FIG. 17, the timing circuit can generate an output signal 1710 from any of the input signals 1720, 1730, or 1740. All of these input signals have a frequency equal to ⅓ the frequency of the output signal; however, their duty cycles respectively equal ⅙, ½, and ⅚. The different input signals that yield the same output signal can be expressed by the relationships $$\text{Duty}_{In} = 1/M^*(j + \text{Duty}_{Out}), \quad (3)$$

or $$T_{wIn} = j^* P_{Out} + T_{wOut}; \quad (4)$$

where j=all integers from 0 to (M−1), inclusive.

When operating an HSD at frequencies close to its maximum limit, the user has the flexibility to minimize the high-frequency demands on the HSD by choosing a value of "j" toward the middle of the range indicated above.

Method of testing UUT w/Timing Circuit

Figure 18:
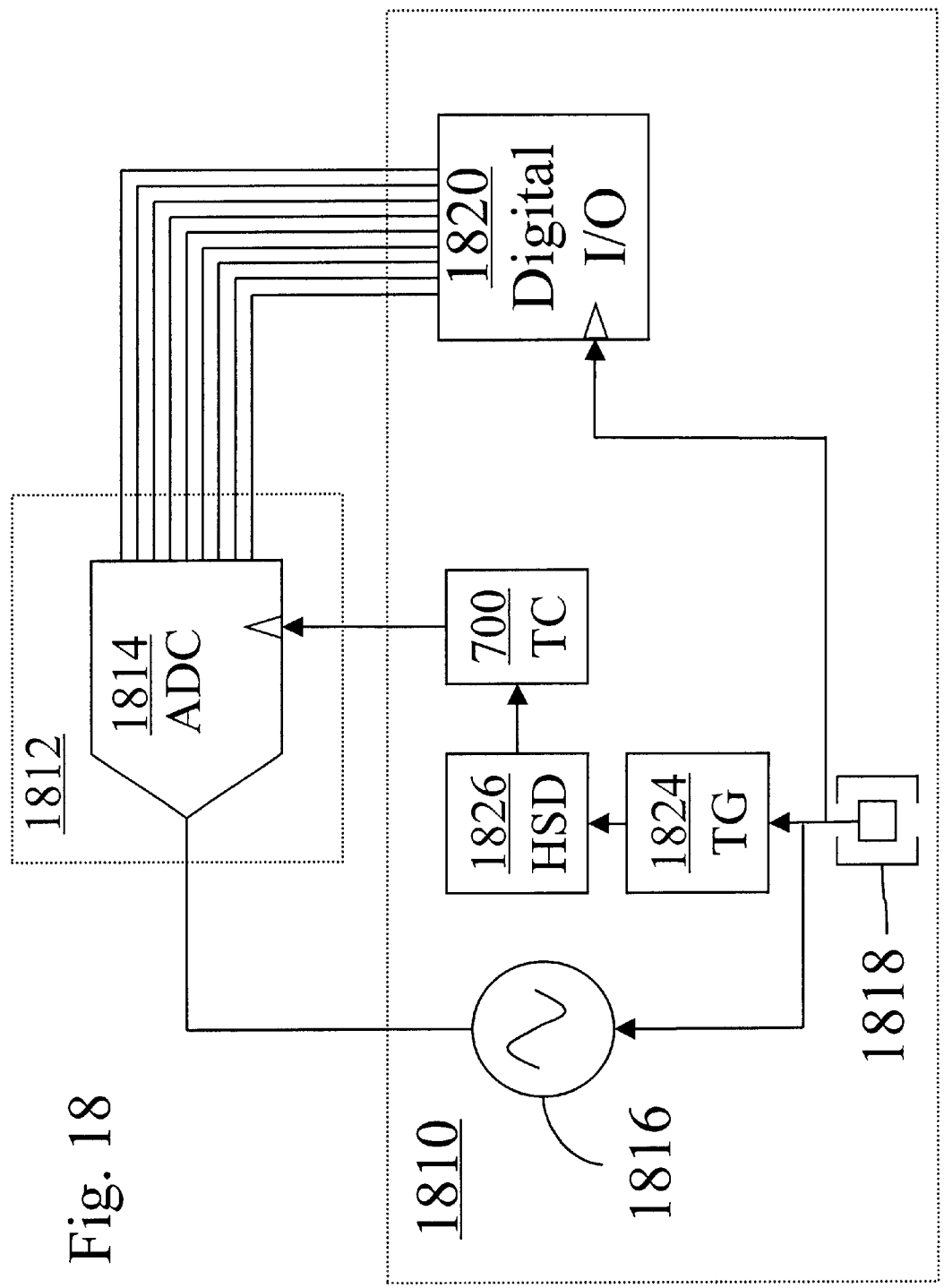
FIG. 18 is a block diagram of an ATE setup for testing a mixed-signal device using the timing circuit of FIG. 7.

FIG. 18 illustrates a setup for testing a UUT 1814 using the timing circuit 700. The ATE system 1810 includes a master clock 1818. The master clock generates a common timing reference for the analog source 1816, digital I/O 1820, and timing generator 1824. Because all of these components are referenced to the ATE master clock 1818, these components are all therefore coherent.

During a typical test of the UUT 1814, a user programs the analog source 1816 to generate a test waveform. The test waveform includes succession of discrete levels established in response to clock pulses from the master clock 1818. In response to user input, the timing generator 1824 derives a desired frequency and pulse width from the master clock 1818. An HSD 1826 outputs the desired clock signal, and the timing circuit 700 generates the desired output clock.

As the UUT 1814 is operated, it generates a succession of digital output signals in response to the output clock from the timing circuit 700. Under user control, the digital I/O 1820 retrieves the digital output signals from the UUT and reports the signals to the ATE for processing.

Preferably, the ATE 1810 includes a software driver (not shown) for configuring the HSD 1826 and the timing circuit 700 to generate the desired output clock. A user preferably specifies a frequency and pulse width of a desired output clock. The software driver then sets an optimal pulse width and frequency of the HSD, in accordance with equation (1) above. The driver also programs the timing circuit 700 by setting the frequency dividers, the PGA gain, and the coarse adjustment value of the VCO 916.

The coherent configuration of the ATE system 1810 promotes accurate and efficient testing. As all components operate under control of the master clock, most of the jitter of the master clock 1818 is common to all components. This common, or correlated jitter passes through the timing circuit 700 and contributes only small measurement errors. Moreover, most of the uncorrelated jitter is filtered by the timing circuit 700. Thus, uncorrelated jitter contributes small errors, as well.

Because the configuration promoted by the timing circuit 700 is coherent, it reduces "skirts" in the power spectra of sampled signals, and therefore promotes accuracy. The coherent configuration also eliminates the need for windowing of input data. As the ATE controls the generation of analog signals as well as the sampling and reading of the UUT and digital I/O, the ATE has no need to arbitrarily bound input signals with windows before performing DSP. Computational burdens on the ATE are reduced, as the ATE is not called upon to process as much noise.

The timing circuit 700 integrates smoothly with current ATE systems. Most ATE systems have a master clock that coordinates activities throughout the ATE. The timing circuit 700 can be added to these systems to improve their performance with only small changes to the ATE. The timing circuit 700 improves the accuracy of these ATE systems by passing correlated jitter and filtering uncorrelated jitter from the digital channels.

In the operating example of FIG. 18, the UUT is an analog-to-digital converter. It should be understood, however, that the testing principles described above also apply to other mixed-signal devices, such as digital-to-analog converters, modems, disk drive controllers, transceiver links, digital radios, and high-speed interpolators.

Having described one embodiment, numerous alternative embodiments or variations might be made. For example, the tailoring of PLLs to reject uncorrelated jitter involves low-pass filtering the PLLs at about 5 kHz. This is merely an illustration. The filtering arrangement can be modified to reduce uncorrelated jitter wherever it may appear. For example, the frequency response of the loop filter could be varied to provide a different bandwidth. Alternatively, the PLLs could use band-pass, band-stop, or high-pass filters, or combinations thereof, to target specific frequency bands of jitter, as needed.

The input to the timing circuit described above is an HSD. The timing circuit is usable, however, with other signal sources within the test system, or with external signal sources. In different applications, the bandwidth of the PLLs can be tailored to suit the jitter characteristics of the signal source used.

Therefore, the invention should be limited only by the spirit and scope of the appended claims.

What is claimed is:

1. A timing circuit for automatic test equipment, comprising:
   a first phase-locked loop having an output generating a first clock signal;
   a second phase-locked loop having an output generating a second clock signal, the first and second clock signals having a predetermined phase relationship; and
   a combiner, including a flip-flop having first and second inputs respectively coupled to the outputs of the first and second phase-locked loops, and an output for alternately setting and resetting to generate a succession of high and low logic levels in response to the first and second clock signals.

2. The timing circuit of claim 1, further comprising:
   a differential circuit having an input that receives an input signal and having first and second outputs that respectively provide inverted and non-inverted versions of the input signal,
   wherein the first output of the differential circuit is coupled to an input of the first phase-locked loop and the second output of the differential circuit is coupled to an input of the second phase-locked loop.

3. The timing circuit of claim 1,
   wherein the flip-flop is a SET/RESET flip-flop having a SET input that is one of the first and second inputs of the flip-flop, and a RESET input that is the other of the SET and RESET inputs, the combining circuit firther comprising:
   a first one-shot circuit having an input coupled to the output of the first phase-locked loop and an output coupled to the first input of the flip-flop; and
   a second one-shot circuit having an input coupled to the output of the second phase-locked loop and an output coupled to the second input of the flip-flop.

4. The timing circuit of claim 3, wherein the first and second one-shot circuits each comprise:
   a logic gate having an inverting input and a non-inverting input both coupled to the input of the respective one-shot circuit; and
   an delay element interposed between the inverting input of the logic gate and the input of the respective one-shot circuit.

5. The timing circuit of claim 4, wherein the delay element comprises an additional length of trace on a circuit board.

6. The timing circuit of claim 1, wherein each of the first and second phase-locked loops has an input and comprises:
   a phase detector having first and second inputs and an output, the first input being coupled to the input of the phase-locked loop and the second input being coupled to the output of the phase-locked loop;

a loop filter having an input and an output, the input being coupled to the output of the phase detector circuit; and an oscillator having an input and an output, the input being coupled to the output of the loop filter.

7. The timing circuit of claim 6, further comprising:

a programmable gain amplifier having a gain, an input coupled to the output of the loop filter and an output coupled to the input of the oscillator;

a first frequency divider having a divider constant N, an input coupled to the output of the oscillator circuit and an output coupled to the output of the phase-locked loop, and means for varying the gain of the programmable gain amplifier in response to the divider constant N to maintain a substantially constant loop gain of the phase-locked loop.

8. The timing circuit of claim 6, further comprising:

a programmable gain amplifier having a gain, an input coupled to the output of the loop filter and an output coupled to the input of the oscillator circuit;

a frequency divider having a divider constant M and coupled in series between the output of the phase-locked loop circuit and the second input of the phase detector circuit, and means for varying the gain of the programmable gain amplifier in response to the divider constant M to maintain a substantially constant loop gain of the phase-locked loop.

9. The timing circuit of claim 1, wherein:

input noise is carried on an input signal to the phase-locked loops, internal noise is generated within the phase-locked loops, the input noise and internal noise being functions of frequency, the internal noise function falling below the input noise function at a crossover frequency, and the first and second phase-locked loops have a bandwidth substantially equal to the crossover frequency between the input noise and internal noise functions.

10. The timing circuit of claim 6, wherein the phase detector circuit comprises:

a digital phase detector having outputs that provide digital logic levels; and a voltage-controlled current amplifier having inputs coupled to the outputs of the digital phase detector, and generating an output current in response to the digital logic levels provided thereby.

11. The timing circuit of claim 10, further comprising a lock detect circuit, comprising:

a differential amplifier having first and second differential inputs coupled to UP and DOWN digital outputs of the digital phase detector;

an absolute value circuit having an input coupled to the output of the differential amplifier and an output that generates a positive signal for both positive and negative differential inputs to the differential amplifier; and a comparator having a first input coupled to the output of the absolute value circuit and a second input receiving a reference signal, the comparator generating a locked signal in response to the output of the absolute value circuit crossing the reference signal.

12. The timing circuit of claim 6, wherein the oscillator comprises a YIG oscillator circuit.

13. The timing circuit of claim 12, wherein the YIG oscillator circuit has a fine adjust input coupled to the input of the oscillator and a course adjust input, the oscillator further comprising:

a digital-to-analog converter (DAC) circuit having an output; and a course tune driver circuit having an input coupled to the output of the DAC circuit and a current-controlled output coupled to the course adjust input of the YIG oscillator circuit.

14. The timing circuit of claim 13, wherein the oscillator further comprises:

a fine tune driver having an input coupled in series between the input of the oscillator and the fine adjust input of the YIG oscillator circuit, wherein the output of the fine tune driver is a current-controlled output.

15. A method of generating a low-jitter clock signal having controlled duty cycle from an input signal, comprising:

coupling the input clock signal to first and second phase-locked loops;

generating, by the first phase-locked loop, a first regenerated clock signal that is phase-locked to falling edges of the input signal;

generating, by the second phase-locked loop, a second regenerated clock signal that is phase-locked to falling edges of the input signal; and combining the first and second regenerated clock signals to generate an output clock having an alternating succession of high and low logic levels, wherein the combining step includes a flip-flop alternately setting and resetting in response to logic transitions of the first and second regenerated clock signals.

16. The method of claim 15, wherein the flip-flop is a set-reset flip-flop, and the combining step comprises:

coupling one of the first and second regenerated clock signals to a SET input of the set-reset flip-flop, and coupling the other of the first and second regenerated clock signals to a RESET input of the set-reset flip-flop.

17. The method of claim 15, wherein each phase-locked loop includes a feedback path and a forward path, the forward path including an oscillator circuit, the method further comprising:

dividing a frequency of a signal from the oscillator circuit in the forward path; and dividing a frequency of the regenerated clock of the respective phase-locked loop circuit in the feedback path, thereby generating a wide range of output frequencies.

18. The method of claim 15, further comprising each phase-locked loop filtering jitter from the input signal.

19. The method of claim 18, wherein the input signal includes a first frequency band that includes jitter components common to the system master clock and a second frequency band that includes jitter components not common to the system master clock, the method further comprising each phase-locked loop substantially passing the first fre quency band and substantially filtering the second frequency band.

20. The method of claim 15, further comprising varying a duty cycle of the input signal to vary the duty cycle of the output clock.

21. The method of claim 20, further comprising:

the first and second phase-locked loops multiplying the frequency of the input clock signal by a constant, wherein the frequency of the output clock equals a multiple of the frequency of-the input clock, and the duty cycle of the output clock varies with the duty cycle of the input clock.

22. The method of claim 21, wherein the pulse width of the output clock equals the remainder of the pulse width of the input clock divided by the period of the output clock.

* * * * *